United States Patent
Yano et al.

(10) Patent No.: US 8,153,031 B2
(45) Date of Patent: Apr. 10, 2012

(54) IN-GA-ZN-SN TYPE OXIDE SINTER AND TARGET FOR PHYSICAL FILM DEPOSITION

(75) Inventors: Koki Yano, Chiba (JP); Kazuyoshi Inoue, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 329 days.

(21) Appl. No.: 12/599,548

(22) PCT Filed: Nov. 30, 2007

(86) PCT No.: PCT/JP2007/073135
§ 371 (c)(1),
(2), (4) Date: Nov. 10, 2009

(87) PCT Pub. No.: WO2008/139654
PCT Pub. Date: Nov. 20, 2008

(65) Prior Publication Data
US 2011/0260118 A1    Oct. 27, 2011

(30) Foreign Application Priority Data

May 11, 2007    (JP) .................................. 2007-126525

(51) Int. Cl.
*H01B 1/02* (2006.01)
(52) U.S. Cl. ............. 252/518.1; 252/519.51; 252/520.2; 204/192.15; 204/192.29; 204/298.12; 204/298.13; 257/57; 257/59
(58) Field of Classification Search ............... 252/518.1, 252/519.51, 520.2; 204/192.15, 192.29; 204/298.12, 298.13; 257/57, 59
See application file for complete search history.

(56) References Cited

U.S. PATENT DOCUMENTS

| | | |
|---|---|---|
| 2004/0222089 A1 * | 11/2004 | Inoue et al. ............... 204/298.12 |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113565 A1 | 6/2006 | Abe et al. |
| 2007/0170434 A1 | 7/2007 | Inoue et al. |
| 2008/0251729 A1 | 10/2008 | Saito et al. |
| 2008/0290286 A1 | 11/2008 | Saito et al. |
| 2009/0146072 A1 | 6/2009 | Saito et al. |
| 2009/0179199 A1 | 7/2009 | Sano et al. |

FOREIGN PATENT DOCUMENTS

JP    4-272612 A    9/1992
(Continued)

OTHER PUBLICATIONS

D. D. Edwards et al., "A Structural Investigation of $Ga_{3-x}In_{5+x}Sn_2O_{16}$", Journal of Solid State Chemistry, vol. 140 (1998) pp. 242-250.

(Continued)

*Primary Examiner* — Khanh Tuan Nguyen
(74) *Attorney, Agent, or Firm* — Millen, White, Zelano & Branigan, P.C.

(57) ABSTRACT

An oxide sintered body including an indium element (In), a gallium element (Ga), a zinc element (Zn) and a tin element (Sn), and including a compound shown by $Ga_2In_6Sn_2O_{16}$ or $(Ga,In)_2O_3$.

18 Claims, 11 Drawing Sheets

FOREIGN PATENT DOCUMENTS

| | | |
|---|---|---|
| JP | 2005-314734 A | 11/2005 |
| JP | 2006-165527 A | 6/2006 |
| JP | 2006-165528 A | 6/2006 |
| JP | 2006-165529 A | 6/2006 |
| JP | 2006-165530 A | 6/2006 |
| JP | 2006-165531 A | 6/2006 |
| JP | 2006-165532 A | 6/2006 |
| JP | 2006-173580 A | 6/2006 |
| JP | 2007-84842 A | 4/2007 |
| WO | WO 03/014409 A1 | 2/2003 |

OTHER PUBLICATIONS

International Search Report of PCT/JP2007/073135 (Feb. 21, 2008).
Written Opinion of the International Searching Authority for PCT/JP2007/073135.

* cited by examiner

IN-GA-ZN-SN TYPE OXIDE SINTER AND TARGET FOR PHYSICAL FILM DEPOSITION

TECHNICAL FIELD

The invention relates to an oxide sintered body and a target for physical film formation composed of an oxide sintered body.

BACKGROUND ART

An oxide semiconductor film composed of several metal composite oxides has a high degree of carrier mobility and visible ray transmittance. Therefore, it is used in a variety of fields including a switching element, a driving circuit element or the like for a liquid crystal display, a thin film electroluminescence display, an electrophoresis display, a moving particle display.

Of these oxide semiconductor films composed of metal composite oxides, an oxide semiconductor film composed of indium oxide-gallium oxide-zinc oxide, which is called IGZO, is used most widely. In addition to IGZO, indium oxide-zinc oxide (IZO), one obtained by adding zinc oxide to tin oxide (ZTO), one obtained by adding gallium oxide to indium oxide-zinc oxide-tin oxide or the like are known. They differ from each other in easiness in production, cost, properties or the like, and hence, they are used appropriately according to applications.

Of these, an oxide semiconductor film composed of an oxide of In, Ga and Zn (IGZO) or composed mainly of these oxides has attracted attention in each application since it has an advantage that the carrier mobility is large as compared with an amorphous silicon film (see Patent Documents 1 to 7, for example).

Generally, a sputtering target used for forming an oxide semiconductor film composed of indium oxide-gallium oxide-zinc oxide is produced by steps of mixing of raw material particles, pre-firing, pulverizing, granulating, molding, sintering and reducing. Due to the large number of steps, this target has disadvantages of low productivity and high cost. In addition, although the bulk resistance of a target is decreased by reduction, the conductivity thereof after reduction is utmost 90 S/cm (specific bulk resistance: 0.011 Ωcm). That is, it is impossible to obtain a target with a sufficiently low resistance.

Therefore, it is desirable to omit even one of the above-mentioned steps. However, no improvement has been made on the steps, and targets are currently produced by conventional production steps.

Meanwhile, it is known that an IGZO sputtering target is composed mainly of a compound shown by $InGaO_3(ZnO)m$ (m is an integer of 1 to 20). Further, a compound shown by $InGaO_3(ZnO)_2$, $InGaO_3(ZnO)_3$, $InGaO_3(ZnO)_4$, $InGaO_3(ZnO)_5$ or $InGaO_3(ZnO)_7$, and methods for producing thereof are known.

However, as for the raw material powder used in these methods, description is only made that a particularly preferable particle size is 10 μm or less. In addition, while generation of each compound is confirmed, no description is made on the specific bulk resistance value. Accordingly, these compounds are defective to be used in a sputtering target.

In addition, a problem occurs that, when sputtering (DC sputtering, for example) is conducted using an IGZO sputtering target, a compound shown by $InGaO_3(ZnO)m$ is grown extraordinary to cause abnormal discharge, resulting in the formation of a defective film.

Further, the resulting oxide film has poor resistance to chemicals, and hence, is dissolved in a PAN (phosphoric acid-acetic acid-nitric acid)-based etching solution which is used in etching for metal wires. As a result, when producing a thin film transistor or the like using a semiconductor film, restrictions are imposed on the structure or the process.

Patent Document 1: JP-A-2006-165527
Patent Document 2: JP-A-2006-165528
Patent Document 3: JP-A-2006-165529
Patent Document 4: JP-A-2006-165530
Patent Document 5: JP-A-2006-165531
Patent Document 6: JP-A-2006-165532
Patent Document 7: JP-A-2006-173580

An object of the invention is to provide a target for physical film formation which can suppress occurrence of abnormal discharge during sputtering, and to provide an oxide semiconductor film having a high PAN resistance.

DISCLOSURE OF THE INVENTION

The inventors made intensive studies, and as a result, have found that, when an oxide sintered body constituting a target for physical film formation contains a prescribed compound (crystal components), the resistance of a target can be decreased, generation of abnormal discharge during sputtering can be suppressed, and the PAN resistance of the resulting oxide semiconductor film can be improved. The invention has been made based on these findings.

According to the invention, the following oxide sintered body or the like can be provided.

1. An oxide sintered body comprising an indium element (In), a gallium element (Ga), a zinc element (Zn) and a tin element (Sn), and comprising a compound shown by $Ga_2In_6Sn_2O_{16}$ or $(Ga,In)_2O_3$.
2. An oxide sintered body comprising an indium element (In), a gallium element (Ga), a zinc element (Zn) and a tin element (Sn), and comprising a compound shown by $Ga_2In_6Sn_2O_{16}$ and a compound shown by $In_2O_3$.
3. An oxide sintered body comprising an indium element (In), a gallium element (Ga), a zinc element (Zn) and a tin element (Sn), and comprising a compound shown by $Ga_2In_6Sn_2O_{16}$ and a compound shown by $InGaZnO_4$.
4. An oxide sintered body comprising an indium element (In), a gallium element (Ga), a zinc element (Zn) and a tin element (Sn), and comprising as a main component a compound shown by $Ga_{2.4}In_{5.6}Sn_2O_{16}$.
5. The oxide sintered body according to any one of 1 to 4, wherein the atomic ratio of each element to the total (In+Ga+Zn+Sn) of the indium element (In), gallium element (Ga), zinc element (Sn) and tin element (Sn) satisfies the following relationships:

$0.15<In/(In+Ga+Zn+Sn)<0.8$ $0.05<Ga/(In+Ga+Zn+Sn)<0.5$ $0.05<Zn/(In+Ga+Zn+Sn)<0.6$ $0.05<Sn/(In+Ga+Zn+Sn)<0.7$

6. A target for physical film formation which comprises the oxide sintered body according to any one of 1 to 5.
7. The target for physical film formation according to claim 6, which is a sputtering target having a bulk resistance of less than 20 mΩcm,
8. An oxide semiconductor film formed by sputtering the target according to 7.

9. A thin film transistor which comprises as an active layer the oxide semiconductor film according to 8.

According to the invention, an oxide sintered body and a target for physical film formation which can suppress occurrence of abnormal discharge during sputtering can be provided.

Also, an oxide semiconductor film having a PAN resistance can be provided.

BEST MODE FOR CARRYING OUT THE INVENTION

The oxide sintered body of the invention contains an indium element (In), a gallium element (Ga), a zinc element (Zn) and a tin element (Sn), and is characterized in that it satisfies any of the following conditions (1) to (4).
(1) Containing a compound shown by $Ga_2In_6Sn_2O_{16}$ and/or $(Ga,In)_2O_3$
(2) Containing a compound shown by $Ga_2In_6Sn_2O_{16}$ and a compound shown by $In_2O_3$
(3) Containing a compound shown by $Ga_2In_6Sn_2O_{16}$ and a compound shown by $InGaZnO_4$
(4) Containing a compound shown by $Ga_{2.4}In_{5.6}Sn_2O_{16}$ as a main component When the oxide sintered body satisfies any of the conditions (1) to (4), occurrence of abnormal discharge during sputtering can be suppressed, and PAN resistance of the resulting oxide semiconductor film can be improved.

Presence of each compound in the oxide sintered body can be confirmed by an X-ray diffraction analysis. The oxide sintered body of the invention may contain other compounds than those mentioned in (1) to (4) above. For example, in the case of (3), in addition to $InGaZnO_4$ and $Ga_2In_6Sn_2O_{16}$, the oxide sintered body may contain $In_2O_3$ or $ZnGa_2O_4$.

Figure 7:
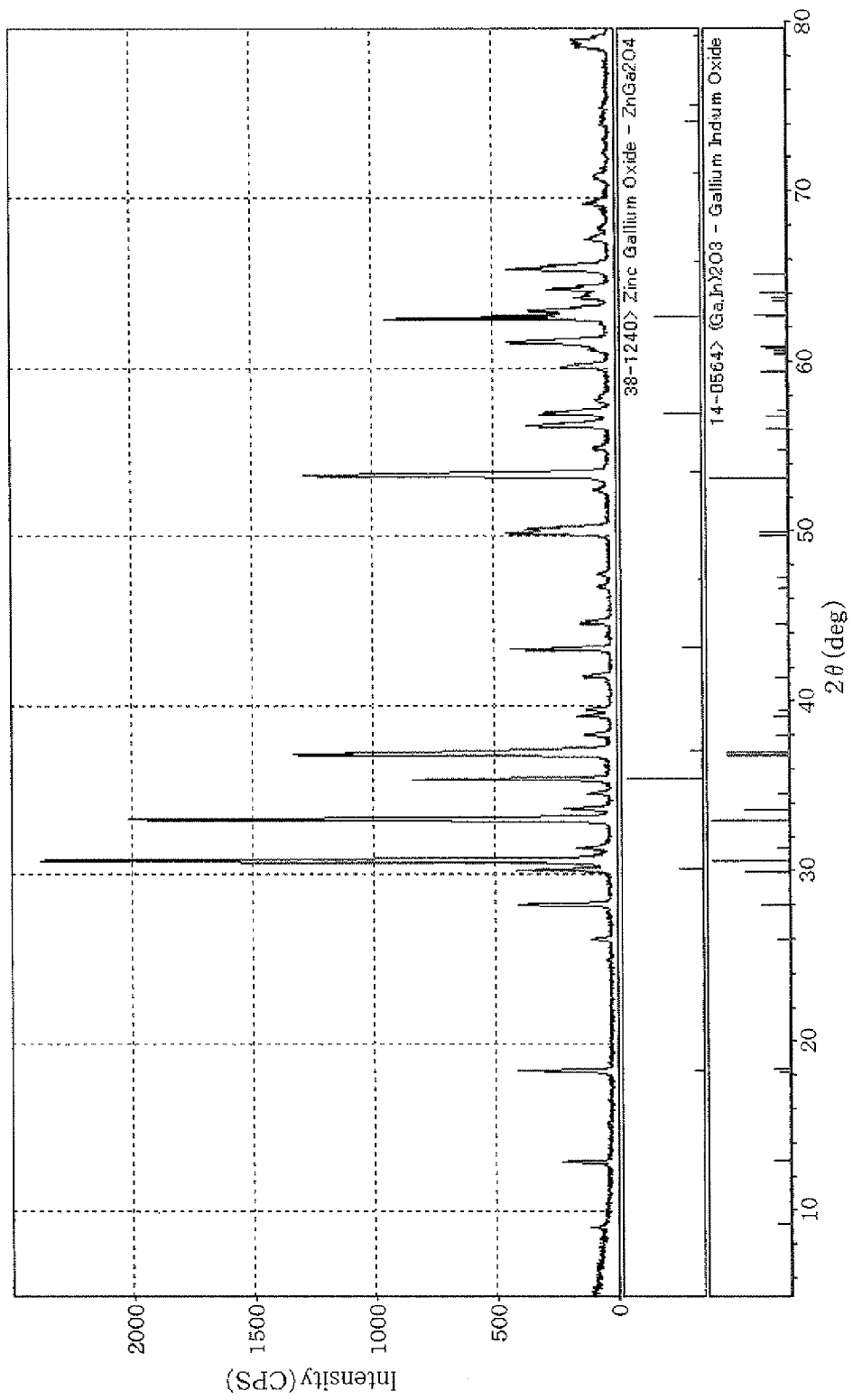
FIG. 7 is an X-ray diffraction chart of a sintered body produced in Example 7.

Here, although the structure of $(Ga,In)_2O_3$ in (1) above has not been clearly elucidated, it means a compound having a structure showing a XRD pattern indicated in JCPDS card number 14-0564 or a pattern similar to this (see FIG. 7).

The "as a main component" in (4) above means that, when a plurality of crystal components are observed in analyzing a chart of an X-ray diffraction analysis (XRD), a crystal component which exhibits the most intense peak is regarded "as a main component". Specifically, the maximum peaks of an XRD pattern identified by a JCPDS card of each component are compared, and a component having the most intense maximum peak is regarded as a main component.

In the oxide sintered body of the invention, it is preferred that $ZnGa_2O_4$, $Ga_3InSn_3O_{12}$ or $Ga_3InSn_3O_{16}$ be not a main component. If the oxide sintered body of the invention contains these compounds, the bulk resistance is increased, making DC sputtering difficult when used as a target. Specifically, the peak intensity of XRD of these components is preferably half or less, more preferably one third or less, of the peak intensity of the main component.

The main component observed by XRD is preferably any of $Ga_2In_6Sn_2O_{16}$, $Ga_{2.4}In_{3.6}Sn_2O_{16}$ or $(Ga,In)_2O_3$.

In the oxide sintered body of the invention, each of the above-mentioned compounds can be obtained by adjusting, for example, the amount ratio of indium oxide powder, gallium oxide powder, zinc oxide powder and tin oxide powder as raw materials or the particle size, the purity, the heating time, the sintering temperature, the sintering time, the sintering atmosphere and the cooling time of the raw material powder.

The particle size of each compound in the oxide sintered body is preferably 20 μm or less, more preferably 10 μm or less. The particle size is an average particle size measured by an electron probe micro-analyzer (EPMA). The particle size of the compound is obtained by adjusting, for example, the amount ratio of each power of indium oxide, gallium oxide, zinc oxide and tin oxide as raw materials or the particle size, the purity, the heating time, the sintering temperature, the sintering time, the sintering atmosphere and the cooling time of the raw material powder.

In the oxide sintered body of the invention, it is preferred that the atomic ratio [X/(In+Ga+Zn+Sn)] of each element (X) to the total (In+Ga+Zn+Sn) of an indium element (In), a gallium element (Ga), a zinc element (Zn) and a tin element (Sn) satisfy the following relationships:

$$0.15 < In/(In+Ga+Zn+Sn) < 0.8$$

$$0.05 < Ga/(In+Ga+Zn+Sn) < 0.5$$

$$0.05 < Zn/(In+Ga+Zn+Sn) < 0.6$$

$$0.05 < Sn/(In+Ga+Zn+Sn) < 0.7$$

If the atomic ratio of an indium element is 0.15 or less, the bulk resistance of the sintered body may not be lowered sufficiently. If the atomic ratio of an indium element is 0.8 or more, conductivity of a thin film formed by using the sintered body may become too high to be used in semiconductor applications.

If the atomic ratio of a gallium element is 0.0 or less, conductivity of a thin film formed by using the sintered body may become too high to be used in semiconductor applications. If the atomic ratio of a gallium element is 0.5 or more, the bulk resistance of the sintered body may not be lowered sufficiently. In addition, if an atomic ratio of a gallium element is 0.5 or more, gallium may be diffused to lower the mobility of a thin film, and a thin film transistor formed using the thin film may have a lowered field effect mobility.

If the atomic ratio of a zinc element is 0.05 or less, conductivity of a thin film formed by using the sintered body may become too high to be used in semiconductor applications. If the atomic ratio of a zinc element is 0.7 or more, the bulk resistance of the sintered body may not be lowered.

If the atomic ratio of a tin element is 0.05 or less, conductivity of a thin film formed by using the sintered body may become too high to be used in semiconductor applications. If the atomic ratio of a tin element is 0.6 or more, the bulk resistance of the sintered body may not be lowered.

It is more preferred that the atomic ratio of each element be as follows.

$$0.2 \leq In/(In+Ga+Zn+Sn) \leq 0.6$$

$$0.08 \leq Ga/(In+Ga+Zn+Sn) \leq 0.4$$

$$0.08 \leq Zn/(In+Ga+Zn+Sn) \leq 0.5$$

$$0.08 \leq Sn/(In+Ga+Zn+Sn) \leq 0.4$$

Further preferably, the atomic ratio of each element is as follows.

$$0.25 \leq In/(In+Ga+Zn+Sn) \leq 0.6$$

$$0.1 \leq Ga/(In+Ga+Zn+Sn) \leq 0.3$$

$$0.1 \leq Zn/(In+Ga+Zn+Sn) \leq 0.4$$

$$0.1 \leq Sn/(In+Ga+Zn+Sn) \leq 0.3$$

The atomic ratio of Sn and Zn (Sn/Zn) is normally 3 or less, preferably 2 or less, further preferably 1 or less, and particularly preferably 0.7 or less. If the atomic ratio of Sn and Zn is larger than 3, nodules may be generated during film formation, causing abnormal discharge.

The oxide sintered body of the invention can be produced by mixing each powder of indium oxide, gallium oxide, zinc oxide and tin oxide, pulverizing and sintering the resulting mixture.

As for the raw material powder, it is preferred that the specific surface area of indium oxide powder be 8 to 10 $m^2/g$, the specific surface area of gallium oxide powder be 5 to 10 $m^2/g$, the specific surface area of zinc oxide powder be 2 to 4 $m^2/g$ and the specific surface area of tin oxide powder be 8 to 10 $m^2/g$. It is preferred that the median diameter of indium oxide powder be 1 to 2 μm, the median diameter of gallium oxide powder be 1 to 2 μm, the median diameter of zinc oxide powder be 0.8 to 1.6 μm and the median diameter of tin oxide powder be 1 to 2 μm.

It is preferable to use powder in which the specific surface area of indium oxide powder and the specific surface area of gallium oxide powder be almost the same. Use of such powder enables more efficient pulverization and mixing. Specifically, it is preferable to allow the difference in specific surface area to be 5 $m^2/g$ or less. If the difference in specific surface area is too large, efficient pulverization and mixing may not be conducted, and gallium oxide particles may remain in the sintered body.

In the raw material powder, the amount ratio of indium oxide powder, gallium oxide powder, zinc oxide powder and tin oxide powder (indium oxide powder:gallium oxide powder:zinc oxide powder:tin oxide powder) may be adjusted such that the atomic ratio of each element is the above-mentioned ratio. For example, it is preferred that the raw material powder be weighed such that the amount ratio of each powder be almost 51:15:17:17 in weight ratio.

As long as the powder mixture containing indium oxide powder, gallium oxide powder, zinc oxide powder and tin oxide powder is used, it is possible to add other components which improve the properties of the sintered body.

The powder mixture is subjected to mixing and pulverizing by using a wet stirred media mill, for example. In this case, it is preferred that pulverization be performed such that the specific surface area after pulverization be increased by 1.5 to 2.5 $m^2/g$ as compared with the specific surface area of the raw material powder mixture or such that the average median diameter after pulverization become 0.6 to 1 μm. By using the thus adjusted raw material powder, it is possible to obtain a high-density oxide sintered body without the need of a pre-firing step. In addition, a reduction step can also be omitted.

If the increase in specific surface area of the raw material powder is less than 1.0 $m^2/g$ or if the average median diameter of the raw material powder after pulverization exceeds 1 μm, the sintering density may not be increased sufficiently.

On the other hand, if the increase in specific surface area of the raw material powder exceeds 3.0 $m^2/g$ or if the average median diameter of the raw material powder after pulverization is less than 0.6 μm, the amount of contaminants (the amount of impurities) from a pulverizing apparatus or the like at the time of pulverization may be increased.

Here, the specific surface area of each powder is a value measured by the BET method. The median diameter of particle distribution of each powder is a value measured by means of a particle distribution measurement apparatus. These values may be adjusted by pulverizing the powder by a dry pulverization method, a wet pulverization method or the like.

The raw materials after pulverization are dried by means of a spray drier, and then molded. Molding may be conducted by a known method such as pressure molding and cold isostatic pressing.

Then, the resulting molded product is sintered to obtain a sintered body. It is preferred that sintering be performed at a temperature of 1400 to 1600° C., more preferably 1450 to 1600° C. for 2 to 20 hours. As a result, it is possible to obtain a sintered body having a density of 6.0 $g/cm^3$ or more. If the temperature is less than 1400° C., density is not improved. If the temperature exceeds 1600° C., zinc is evaporated, and as a result, the composition of a sintered body may be varied or voids may be generated in a sintered body due to evaporation.

As for sintering, it is preferred that sintering be performed in an oxygen atmosphere by circulating oxygen or be performed under pressure. By doing this, evaporation of zinc can be suppressed, and a sintered body having no voids can be obtained.

The sintered body which is produced by the above-mentioned method has a density as high as 6.0 $g/cm^3$ or more. Since only a small amount of nodules or particles is generated during use, it is possible to produce an oxide semiconductor film improved in film properties.

In the resulting sintered body, $Ga_2In_6Sn_2O_{16}$ is mainly generated.

The oxide sintered body of the invention can be a target for physical film formation by subjecting it to processing such as polishing. Specifically, the sintered body is ground by means of a surface grinder to allow the surface roughness to be 5 μm or less. Further, the sputtering surface of the target may be subjected to mirror finishing, thereby allowing the average surface roughness Ra to be 1000 angstroms or less. For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

By bonding the resulting target for physical film formation to a backing plate, the target can be installed in various apparatuses and used. Examples of the physical film formation include sputtering methods, PLD (pulse laser deposition) methods, vacuum vapor deposition methods and ion plating methods.

In order to clean the target for physical film formation, air blow, running water cleaning or the like can be used. Foreign matters can be removed more effectively by air blow if air intake is conducted by means of a dust collector from the side opposite from the air blow nozzle.

In addition to air blow or running water cleaning, ultrasonic cleaning or the like can also be conducted. In ultrasonic cleaning, it is effective to conduct multiplex oscillation within a frequency range of 25 to 300 kHz. For example, it is preferable to perform ultrasonic cleaning every 25 kHz in a frequency range of 25 to 300 kHz by subjecting 12 kinds of frequency to multiplex oscillation.

In addition, when using the target for physical film formation as a sputtering target, it is preferred that the bulk resistance of the target be less than 20 mΩcm, more preferably less than 10 mΩcm, further preferably less than 5 mΩcm, with less than 2 mΩcm being particularly preferable. If the bulk resistance is 20 mΩcm or more, spark may occur due to abnormal discharge when DC sputtering is conducted for a long period of time. As a result, the target may be cracked or particles jumped out from the target by spark may adhere to the substrate for film formation, causing performance as the oxide semiconductor film to be lowered. In addition, the target may be cracked during discharge.

The bulk resistance is a value measured by the four probe method using a resistivity meter.

By performing film formation such as sputtering by using the target for physical film formation, an oxide semiconductor film composed mainly of oxides of In, Ga, Zn and Sn can be formed on an object such as a substrate. This oxide semiconductor film is amorphous and shows stable semiconducting properties and excellent PAN resistance. Therefore, it is suitable as a material which constitutes a semiconductor layer (active layer) of a thin film transistor (TFT). Since the range of selection of an etching agent can be widened by using the oxide semiconductor film of the invention, the degree of freedom in structure or the production process of a TFT can be enhanced.

In the TFT of the invention, it suffices that the above-mentioned oxide semiconductor film be contained as an active layer. As for other members (insulating films, electrodes, or the like, for example) or configuration, known members or configuration in the TFT field can be used.

In the thin film transistor of the invention, the thickness of an active layer is normally 0.5 to 500 nm, preferably 1 to 150 nm, more preferably 3 to 80 nm, with 10 to 60 nm being particularly preferable. The reason therefor is that it is difficult to form a film uniformly on the industrial basis when the thickness is smaller than 0.5 nm, and when the thickness exceeds 500 nm, film forming time becomes too long to be industrially applied. If the thickness of the active layer is within the range of 3 to 80 nm, particularly excellent TFT characteristics such as mobility or on-off ratio can be obtained.

The ratio of the channel width W and the channel length L (W/L) of a thin film transistor is normally 0.1 to 100, preferably 1 to 20, particularly preferably 2 to 8. The reason therefor is that, if the W/L exceeds 100, the amount of current leakage may be increased or the on-off ratio may be lowered. If the W/L is smaller than 0.1, the field effect mobility may be lowered or pinch-off may be unclear.

The channel length L is normally 0.1 to 1000 μm, preferably 1 to 100 μm, and further preferably 2 to 10 μm. The reason therefor is that, if the channel length L is 0.1 μm or less, the production on the industrial basis may be difficult, short-channel effects may occur, and current leakage may be increased. A channel length L of 1000 μm or more is not preferable since the device becomes too large or the driving voltage may be increased.

There are no restrictions on the material of the gate insulating film of the thin film transistor. Materials which are generally used can be arbitrarily selected within a range which does not impair the advantageous effects of the invention. For example, an oxide such as $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN and SiON can be used. Of these, it is preferable to use $SiO_2$, $SiN_x$, $Al_2O_3$, $Y_2O_3$, $Hf_2O_3$ and $CaHfO_3$. $SiO_2$, $SiN_x$, $Y_2O_3$, $Hf_2O_3$ and $CaHfO_3$ are more preferable, with $Y_2O_3$ being particularly preferable. The number of oxygen in these oxides does not necessarily coincide with the chemical stoichiometric ratio (for example, either $SiO_2$ or $SiN_x$ may be possible).

The gate insulating film may have a structure in which two or more different layers are stacked. The gate insulating film may be crystalline, polycrystalline or amorphous. However, the gate insulating film is preferably polycrystalline or amorphous since a polycrystalline or amorphous film is easily produced on the industrial basis.

There are no particular restrictions on the material of a source electrode or a drain electrode. Within a range which does not impair the advantageous effects of the invention in this embodiment, metals or alloys thereof or oxide conductor materials, which are generally used, can be arbitrary selected.

As the sputtering method for forming an active layer, DC sputtering methods, DC magnetron sputtering methods, AC sputtering methods, AC magnetron sputtering methods, RF sputtering methods, RF magnetron sputtering methods; opposing target sputtering methods, cylindrical target sputtering methods, ECR sputtering methods or the like can be used. As the vacuum vapor deposition method, resistance heating methods, electron beam heating methods, pulse laser deposition (PLD) methods or the like can be used. As the ion plating method, ARE methods and HOPE methods can be used. As the CVD method, thermal CVD methods and plasma CVD methods can be used.

Of these methods, DC magnetron sputtering methods or AC magnetron sputtering methods which are inexpensive, capable of increasing the area and exhibit stable discharge are preferable for industrialization. DC magnetron sputtering methods are particularly preferable. In addition, co-sputtering, reactive sputtering, or RF-superimposed DC sputtering may be used.

When sputtering methods are used, the ultimate pressure is normally $5 \times 10^{-2}$ Pa or less. The reason therefor is that, if the ultimate pressure is larger than $5 \times 10^{-2}$ Pa, mobility may be lowered due to impurities in an atmospheric gas.

In order to avoid such disadvantages more effectively, the ultimate pressure is preferably $5 \times 10^{-3}$ Pa or less, more preferably $5 \times 10^{-4}$ Pa or less, further preferably $1 \times 10^{-4}$ Pa or less, with $5 \times 10^{-5}$ Pa or less being particularly preferable.

The partial oxygen pressure in an atmospheric gas is normally $40 \times 10^{-3}$ Pa or less. If the partial oxygen pressure is larger than $40 \times 10^{-3}$ Pa, mobility may be lowered or carrier concentration may become instable. In addition, residues may be generated at the time of wet etching.

In order to avoid such disadvantages more effectively, the oxygen partial pressure in an atmospheric gas is preferably $15\times10^{-3}$ Pa or less, more preferably $7\times10^{-3}$ Pa or less, with $1\times10^{-3}$ Pa or less being particularly preferable.

The substrate-target distance (S-T distance) at the time of sputtering is normally 150 mm or less, preferably 110 mm, with 80 mm or less being particularly preferable. The reason therefor is that, if the S-T distance is short, the substrate is exposed to plasma during sputtering, and as a result, activation of oxygen can be expected. If the S-T distance is longer than 150 mm, the film forming speed becomes too slow to be industrially applied.

Normally, physical film formation is conducted at a substrate temperature of 250° C. or less. If the substrate temperature is higher than 250° C., effects of a post treatment cannot be exhibited sufficiently, resulting in difficulty in controlling to a low carrier concentration and a high mobility. In order to avoid such disadvantages more effectively, the substrate temperature is preferably 200° C. or less, more preferably 150° C. or less, further preferably 100° C. or less, with 50° C. or less being particularly preferable.

EXAMPLES

The invention will be explained while comparing examples with comparative examples. The examples show preferred examples of the invention, and the invention is not limited to the examples. Therefore, various modifications based on technical ideas or other examples are included in the invention.

Example 1

(1) Oxide Sintered Body

As the raw material powder, indium oxide powder with a specific surface area of 6 m²/g, gallium oxide powder with a specific surface area of 6 m²/g, zinc oxide powder with a specific surface area of 3 m²/g and tin oxide powder with a specific surface area of 6 m²/g were weighed such that the weight ratio became 51:15:17:17 (atomic ratio of metal atoms: 0.43:0.19:0.25:0.13), and the resulting mixture was mixed and pulverized by means of a wet stirred medium mill. Zirconia beads with a diameter of 1 mm were used as the medium.

As compared with the specific surface area of the raw material powder mixture, the specific surface area of the powder was increased by 2 m²/g after pulverization. Then, the powder was dried by means of a spray dryer.

This powder mixture was filled in a mold and then subjected to pressure molding by means of a cold pressing machine. Further, while circulating oxygen, the powder was sintered in an oxygen atmosphere at a high temperature of 1450° C. for 8 hours.

As a result, an oxide sintered body with a density of 6.23 c/cm³ was obtained without conducting pre-firing. The density of the sintered body was calculated from the weight and the external dimensions of a piece of the sintered body which had been cut into a predetermined size.

Figure 1:
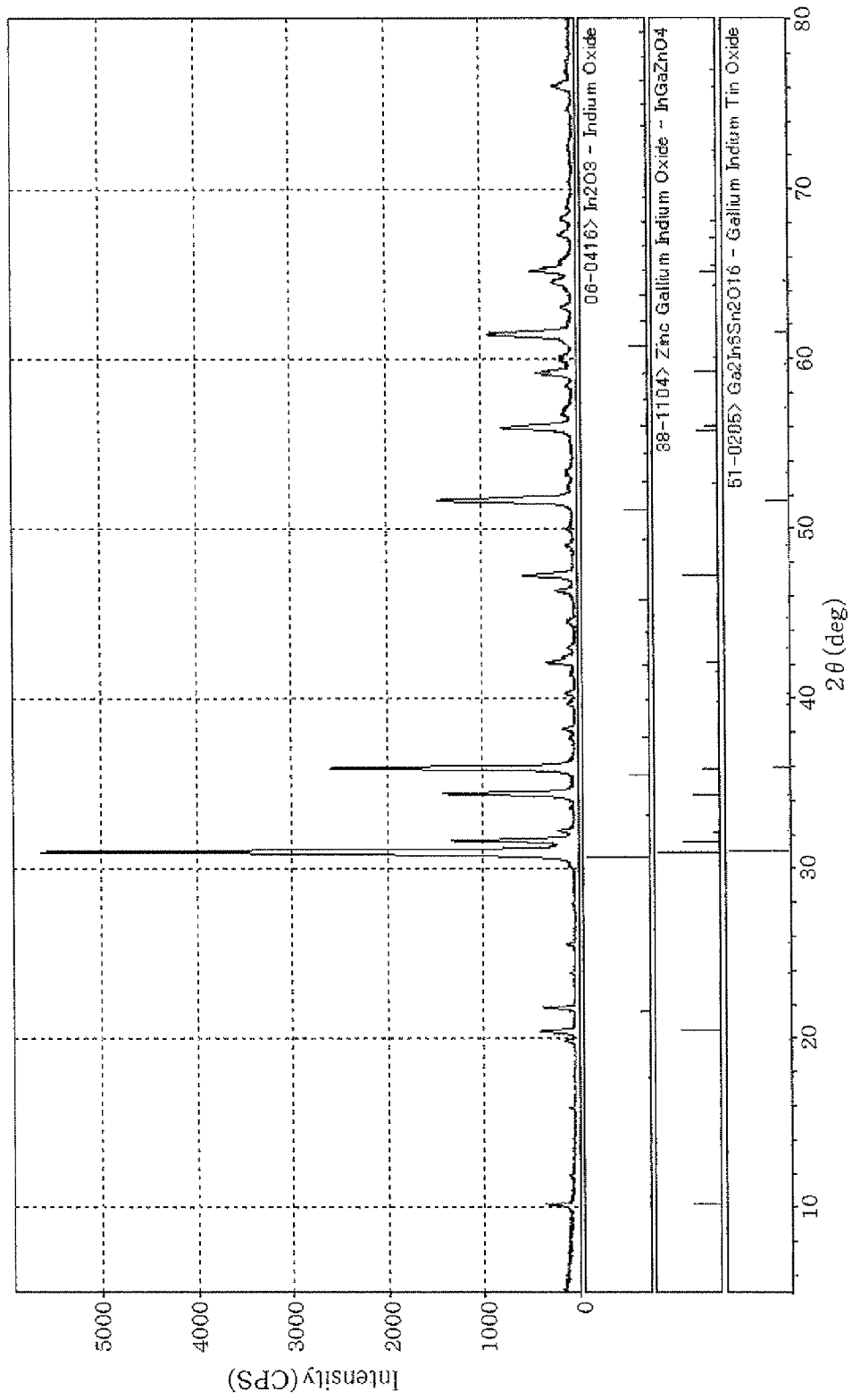
FIG. 1 is an X-ray diffraction chart of a sintered body produced in Example 1.

This sintered body was analyzed by X-ray diffraction. FIG. 1 is an X-ray diffraction chart of the sintered body. From this chart, it could be confirmed that this sintered body contained as a main component a compound shown by $Ga_2In_6Sn_2O_{16}$ and contained compounds shown by $InGaZnO_4$ and $In_2O_3$.

The measurement conditions of the X-ray diffraction (XRD) measurement of the target were as follows.

Apparatus: Ultima-III, manufactured by Rigaku Corporation

X rays: Cu—Kα (wavelength: 1.5406 Å, monochromized by means of a graphite monochrometer)

2θ-θ reflection method, continuous scanning (1.0°/min)

Sampling interval: 0.02°

Slit DS, SS: 2/3°, RS: 0.6 mm

The bulk resistance of the sintered body was measured by the four probe method by means of a resistivity meter (Loresta, manufactured by Mitsubishi Chemical Corporation). As a result, the bulk resistance was found to be 0.95 mΩcm.

(2) Sputtering Target

A sputtering target was prepared by subjecting the sintered body prepared in (1) above to processing such as polishing.

This target was installed in a film formation apparatus (manufactured by Shinko Seiki Co., Ltd.) of RF magnetron sputtering, which is one of sputtering methods, and an oxide semiconductor film was formed on a glass substrate (Corning 1737).

The sputtering conditions were as follows. Substrate temperature; 25° C., ultimate pressure; $5\times10^{-4}$ Pa, atmospheric gas; Ar 98%, oxygen 2%, sputtering pressure (total pressure); $1\times10^{-1}$ Pa, input power; 100 W, film forming time; 25 minutes, S-T distance; 100 mm.

As a result, a transparent conductive glass in which a transparent conductive oxide semiconductor film with a thickness of about 100 nm was formed on the glass substrate was obtained.

Almost no abnormal discharge occurred during formation of the oxide semiconductor film. The reason is not fully elucidated. However, it can be assumed that abnormal growth of $InGaZnO_4$ was suppressed by the presence of $Ga_2In_6Sn_2O_{16}$.

The target was installed in a DC sputtering film forming apparatus (manufactured by Shinko Seiki Co., Ltd.), and an oxide semiconductor film was formed on a glass substrate in the same way as in the case of the RF sputtering film forming apparatus.

The sputtering conditions were as follows. Substrate temperature; 25° C., ultimate pressure; $5\times10^{-4}$ Pa, atmospheric gas; Ar 97%, oxygen 3%, sputtering pressure (total pressure); $3\times10^{-1}$ Pa input power; 200 W, film forming time; 15 minutes, S-T distance; 90 mm.

Almost no abnormal discharge occurred during formation of the oxide semiconductor film, and almost no nodules were generated.

The PAN resistance of the oxide semiconductor film was evaluated. Specifically, the oxide semiconductor film was subjected to etching in a PAN etching solution (about 91.4 wt % of phosphoric acid, about 3.3 wt % of nitric acid and about 5.3 wt % of acetic acid) of about 30° C. The etching speed was then evaluated.

It was found that the etching speed was 10 nm/min or less, which showed that the oxide semiconductor film had resistance to PAN.

The electron carrier density and the mobility measured by means of an AC hall measuring apparatus (manufactured by Toyo Technica Co., Ltd.) were $5\times10^{15}$ cm$^{-3}$ and 4 cm²/Vs, respectively.

The raw material amount ratio, the metal element atomic ratio, the crystal structure, the bulk resistance and the performance during sputtering are shown in Table 1.

As for the crystal type (XRD) of the sintered body, one which was judged by the XRD as a main component was indicated as excellent (⊚) and one which was observed though being not a main component was indicated as good (○).

Regarding the occurrence of abnormal discharge and nodules, evaluation was made based on the following criteria: □: Almost none ⊚ Slightly occurred ○: Occurred x: Frequently occurred -: Film formation could not be conducted

TABLE 1

| | | Examples | | | | | | | | Comparative Examples | | | |
|---|---|---|---|---|---|---|---|---|---|---|---|---|---|
| | | 1 | 2 | 3 | 4 | 5 | 6 | 7 | 8 | 1 | 2 | 3 | 4 |
| Raw material amount ratio in sintered body (mass %) | $In_2O_3$ | 51 | 42 | 41 | 35 | 31 | 34 | 38 | 35 | 45 | 16 | 13 | 12 |
| | $Ga_2O_3$ | 15 | 30 | 7 | 8 | 16 | 23 | 26 | 24 | 30 | 8 | 25 | 23 |
| | ZnO | 17 | 14 | 8 | 20 | 18 | 7 | 22 | 20 | 25 | 27 | 22 | 7 |
| | $Sn_2O$ | 17 | 14 | 44 | 37 | 34 | 36 | 14 | 21 | 0 | 49 | 40 | 59 |
| Metal element composition ratio (at %) (each metal element/total metal elements) | In | 43 | 34 | 38 | 30 | 27 | 30 | 30 | 28 | 34 | 14 | 11 | 11 |
| | Ga | 19 | 36 | 10 | 10 | 20 | 30 | 30 | 28 | 33 | 10 | 30 | 30 |
| | Zn | 25 | 20 | 14 | 30 | 27 | 11 | 30 | 28 | 33 | 38 | 30 | 11 |
| | Sn | 13 | 11 | 38 | 30 | 27 | 30 | 10 | 16 | 0 | 38 | 30 | 49 |
| Crystal type of sintered body (XRD) | $In_2O_3$ | ○ | ○ | | | | | | | | | | |
| | $Ga_2O_3$ | | ○ | | | | | | | | | | |
| | $SnO_2$ | | | ○ | | ○ | | | | | ○ | | |
| | $ZnGa_2O_4$ | | ○ | | | ○ | ○ | ○ | | ○ | | ◎ | ○ |
| | $(Ga, In)_2O_3$ | | | | | | | ◎ | ◎ | | | | |
| | $InGaZnO_4$ | ○ | ○ | | ○ | | | | | ◎ | ◎ | | |
| | $Ga_2In_6Sn_2O_{16}$ | ◎ | ◎ | ◎ | ◎ | | | | | | | | |
| | $Ga_{2.4}In_{5.6}Sn_2O_{16}$ | | | | | ◎ | ◎ | | | | | | |
| | $Ga_3InSn_3O_{12}$ | | | | | | | | | | | ○ | ○ |
| | $Ga_3InSn_5O_{16}$ | | | | | | | | | | | ○ | ◎ |
| Bulk resistance of sintered body (mΩcm) | | 0.95 | 4 | 4.5 | 3 | 8 | 12 | 5 | 7 | 50 | 1100 | 1200 | 1300 |
| State of RF sputtering | Abnormal discharge | ◎ | ◎ | ◎ | ◎ | ◎ | ◎ | ◎ | ◎ | X | X | X | X |
| State of DC sputtering | Abnormal discharge | ◎ | ◎ | ○ | ◎ | ○ | Δ | ◎ | ◎ | X | — | — | — |
| | Nodules generated | ◎ | ◎ | ○ | ◎ | Δ | Δ | ◎ | ◎ | — | — | — | — |

Example 2

An oxide sintered body was obtained in the same manner as in Example 1, except that the indium oxide powder, gallium oxide powder, zinc oxide powder and tin oxide powder were mixed at 42:30:14:14 in weight ratio.

Figure 2:
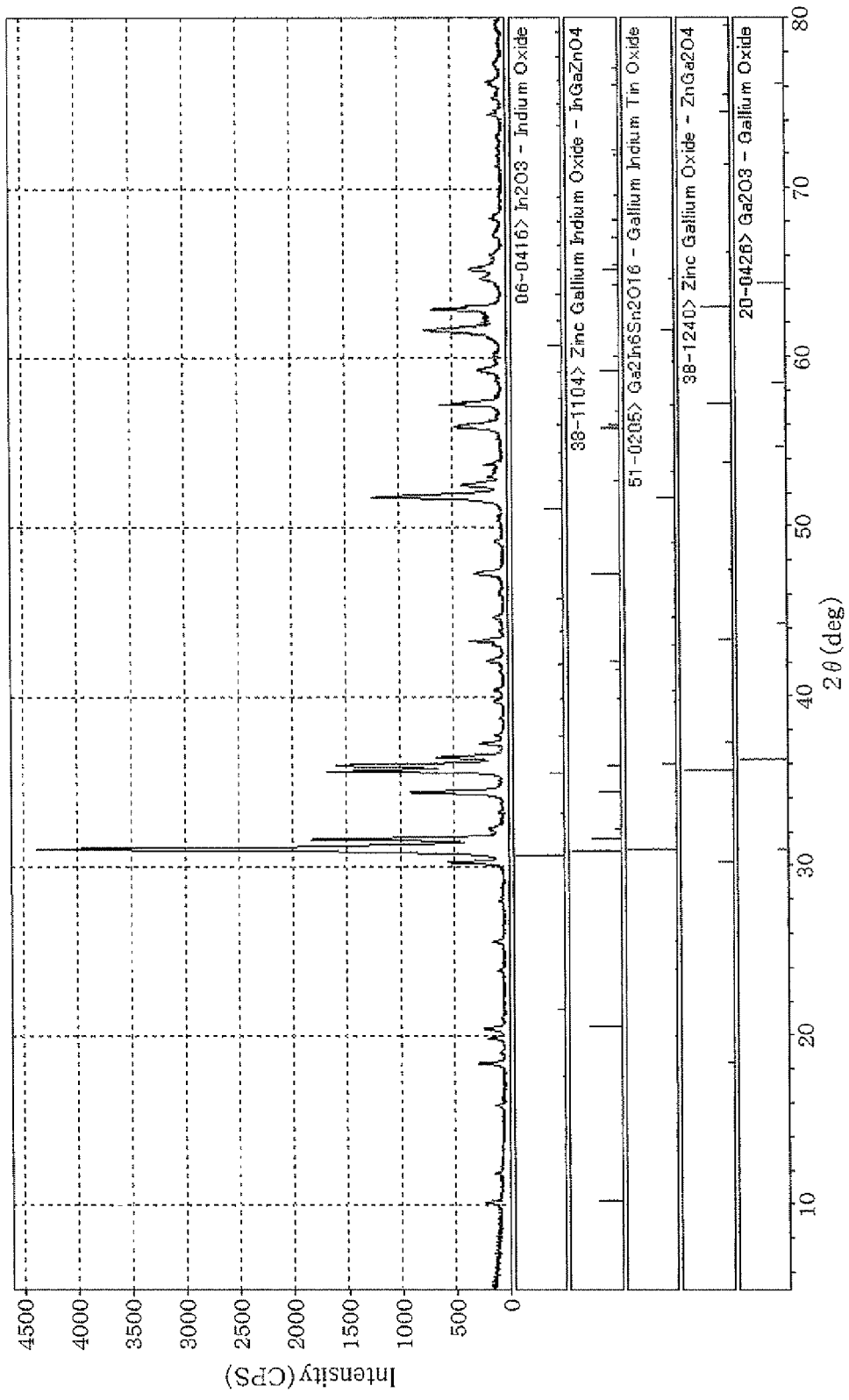
FIG. 2 is an X-ray diffraction chart of a sintered body produced in Example 2.
Figure 3:
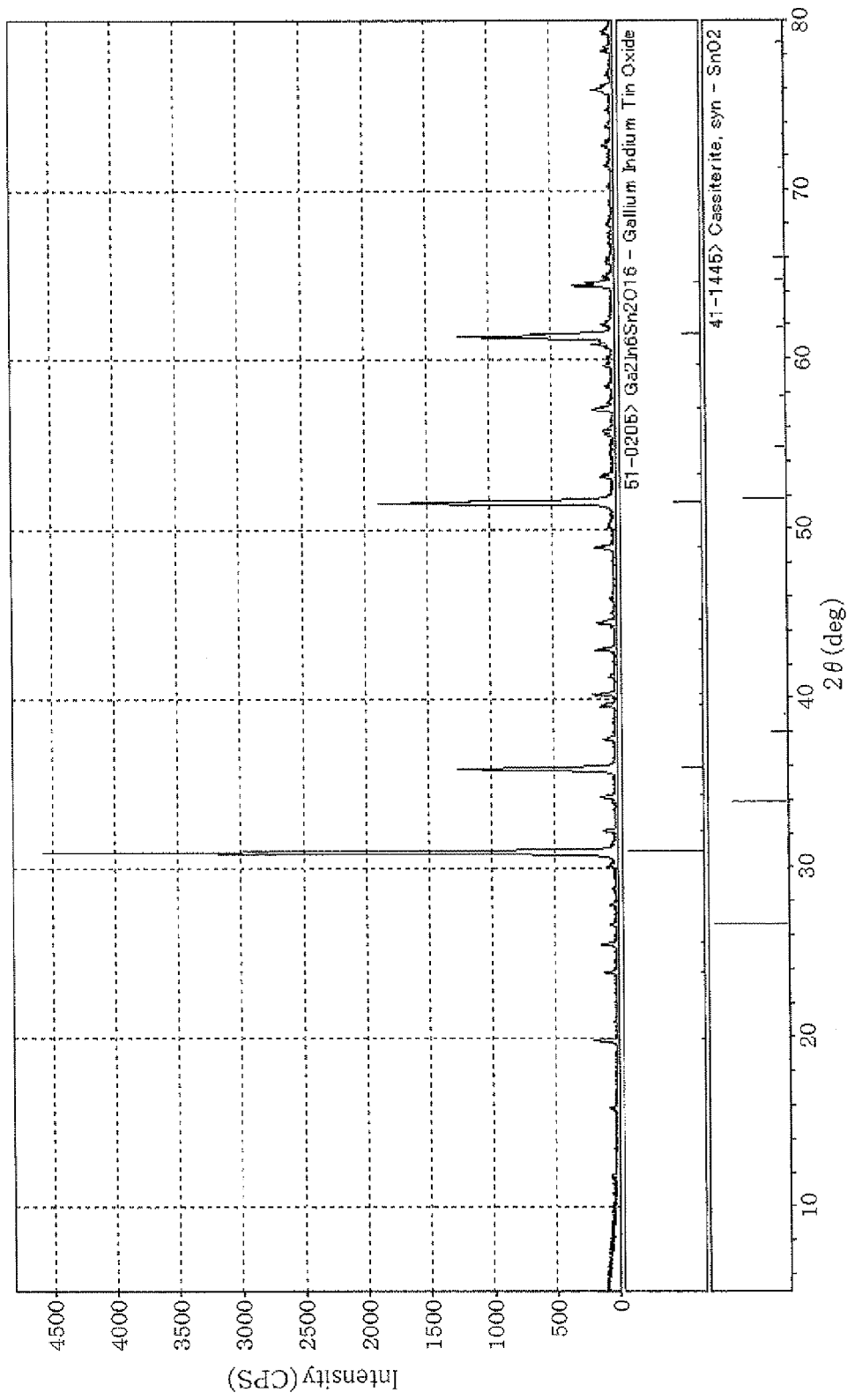
FIG. 3 is an X-ray diffraction chart of a sintered body produced in Example 3.
Figure 4:
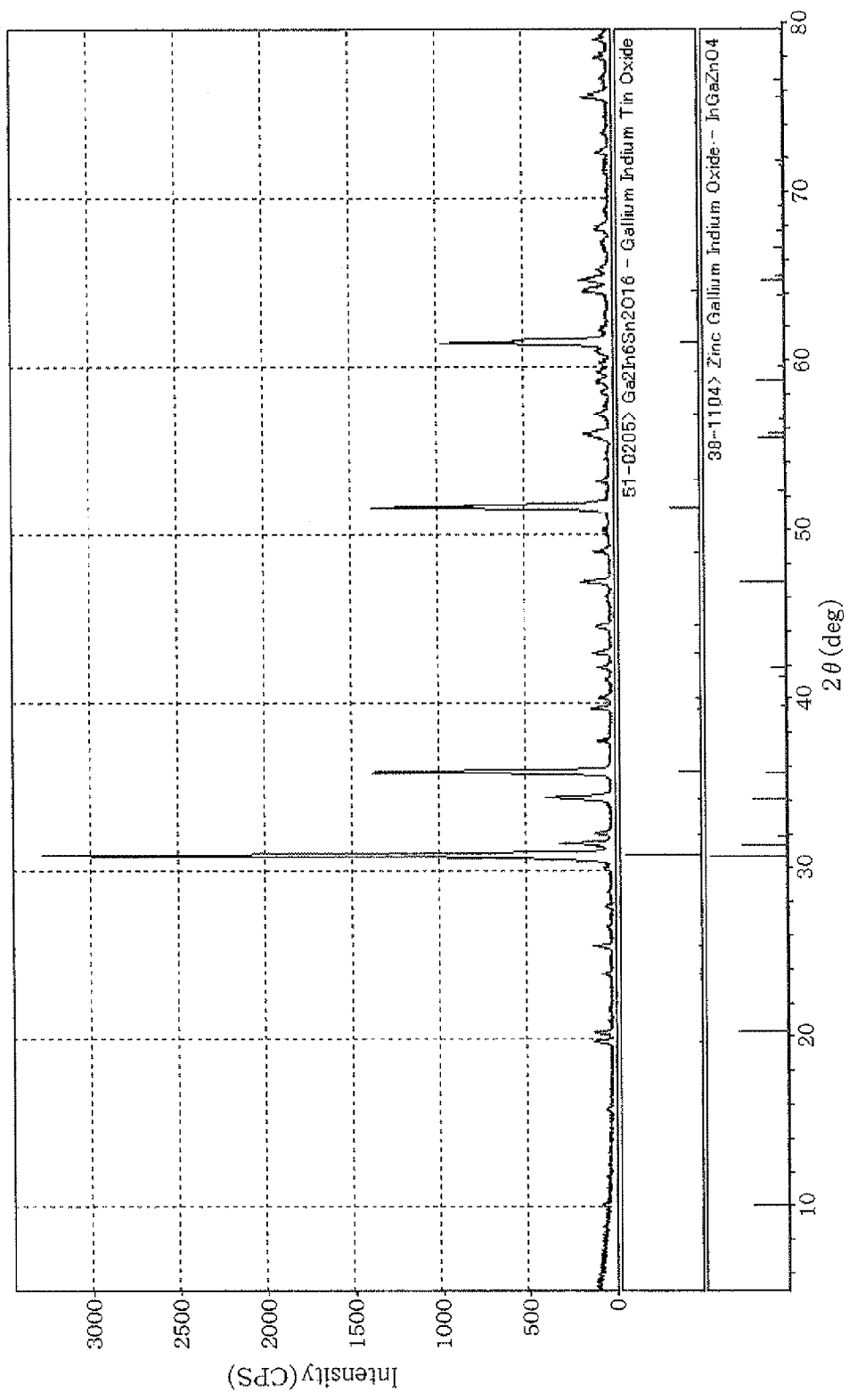
FIG. 4 is an X-ray diffraction chart of a sintered body produced in Example 4.
Figure 5:
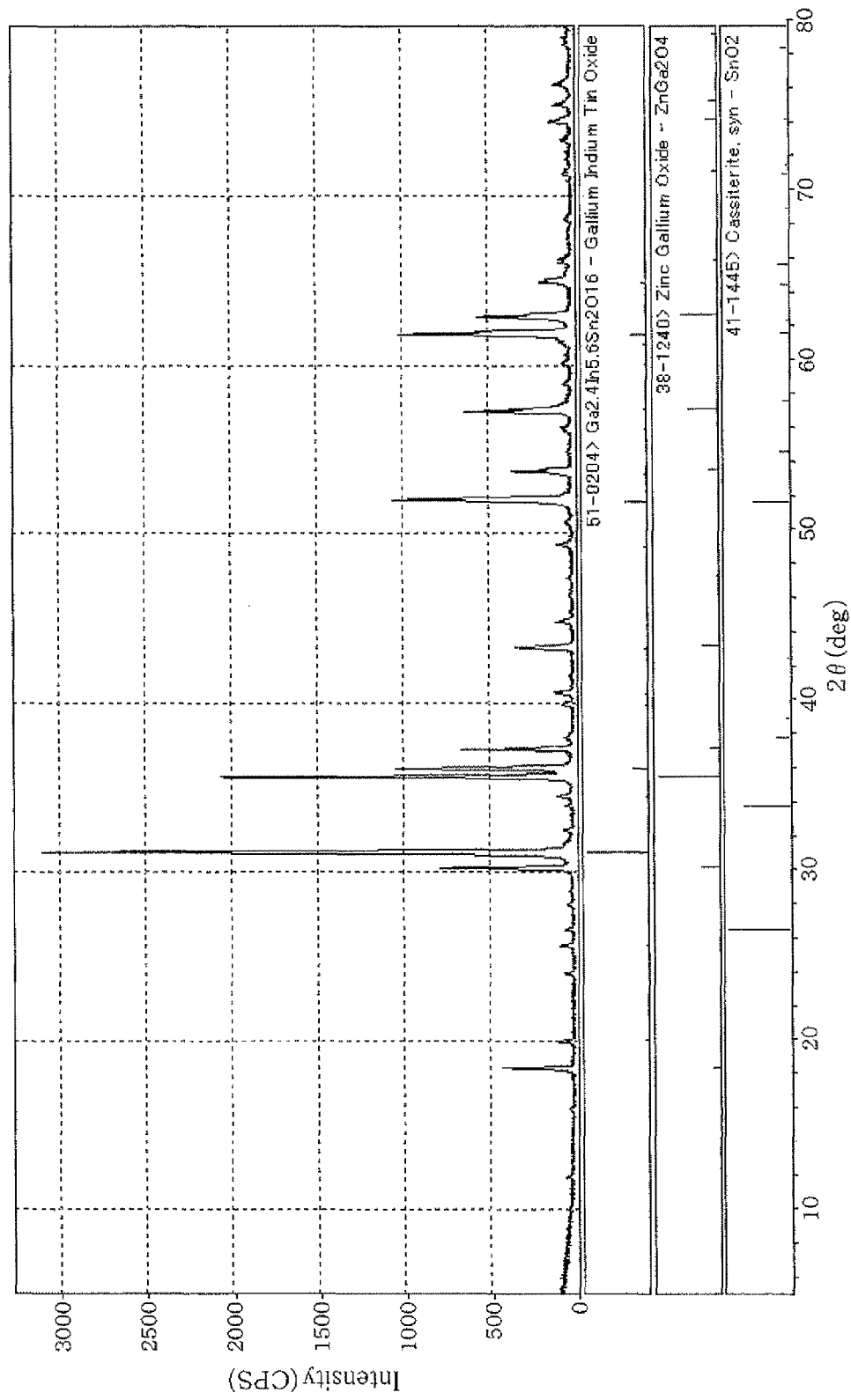
FIG. 5 is an X-ray diffraction chart of a sintered body produced in Example 5.
Figure 6:
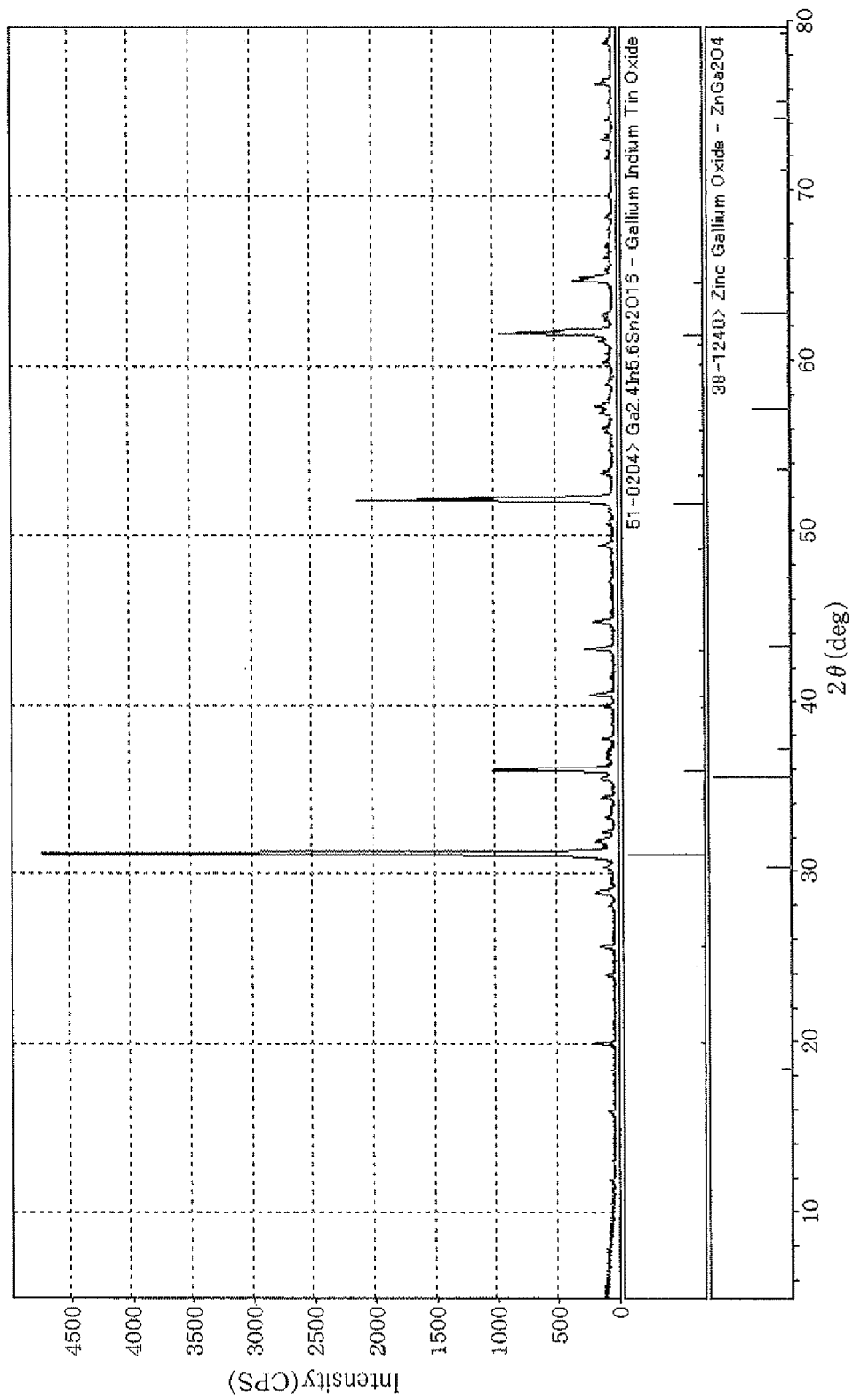
FIG. 6 is an X-ray diffraction chart of a sintered body produced in Example 6.

This sintered body was analyzed by X-ray diffraction. FIG. 2 is an X-ray diffraction chart of the sintered body. From this chart, it could be confirmed that this sintered body contained as a main component a compound shown by $Ga_2In_6Sn_2O_{16}$ and also contained compounds shown by $In_2O_3$, $Ga_2O_3$ or the like.

The bulk resistance of this sintered body was 4 mΩcm.

The resulting sintered body was processed into a target in the same manner as in Example 1, and an oxide semiconductor film was formed by using an RF magnetron sputtering film forming apparatus. The film forming conditions were the same as those in Example 1, and an oxide semiconductor film with a thickness of about 100 nm was formed on a glass substrate. In this example, almost no abnormal discharge was generated during film formation.

The resulting oxide semiconductor film was evaluated for PAN resistance in the same manner as in Example 1. As a result, the etching speed was found to be 10 nm/min or less, which showed that the oxide semiconductor film had resistance to PAN.

Comparative Example 1

An oxide sintered body was prepared in the same manner as in Example 1, except that, as the raw material powder, indium oxide powder with a specific surface area of 6 $m^2/g$, gallium oxide powder with a specific surface area of 6 $m^2/g$ and zinc oxide powder with a specific surface area of 3 $m^2/g$ were mixed at 45:30:25 in weight ratio.

Figure 8:
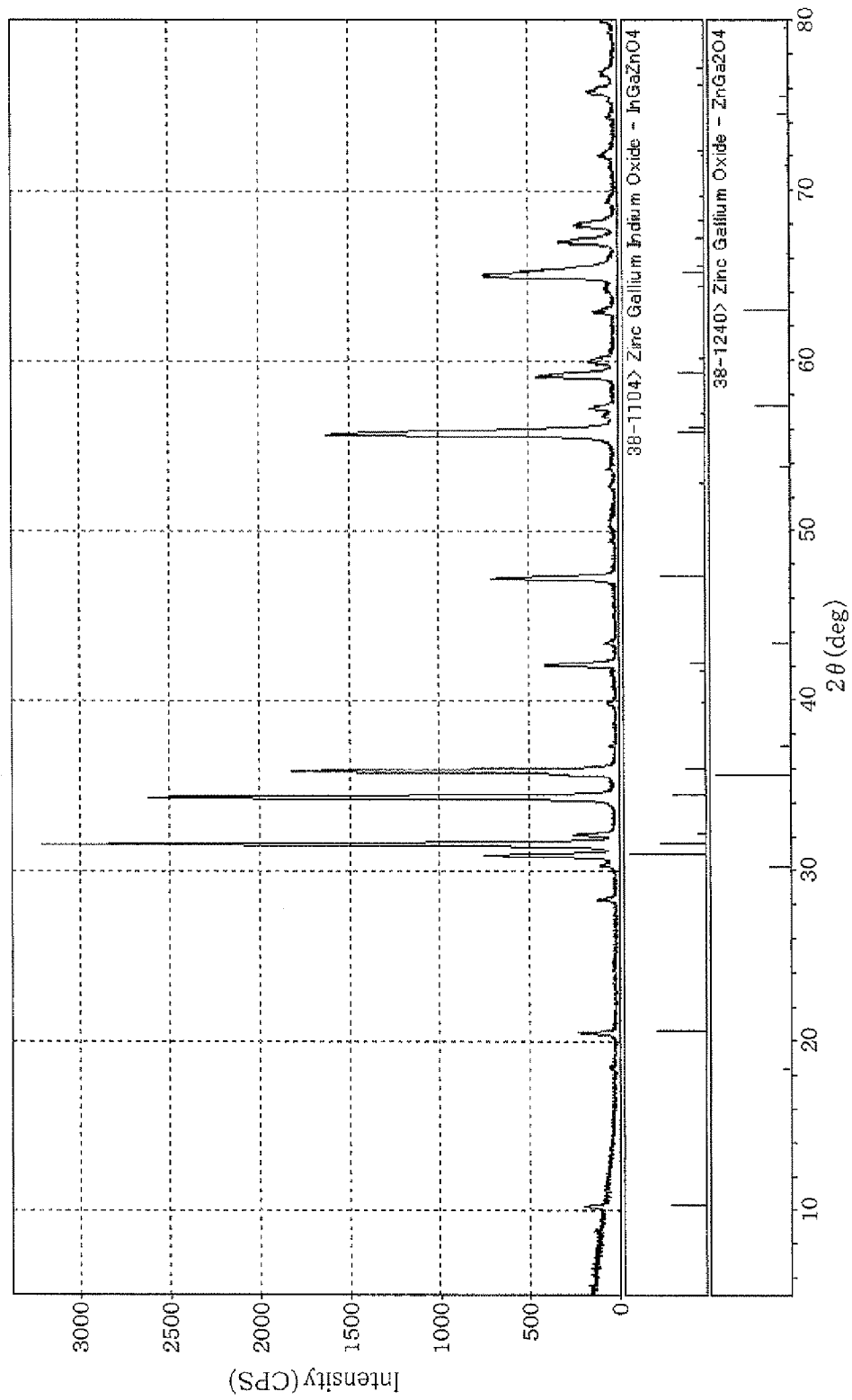
FIG. 8 is an X-ray diffraction chart of a sintered body produced in Comparative Example 1.
Figure 9:
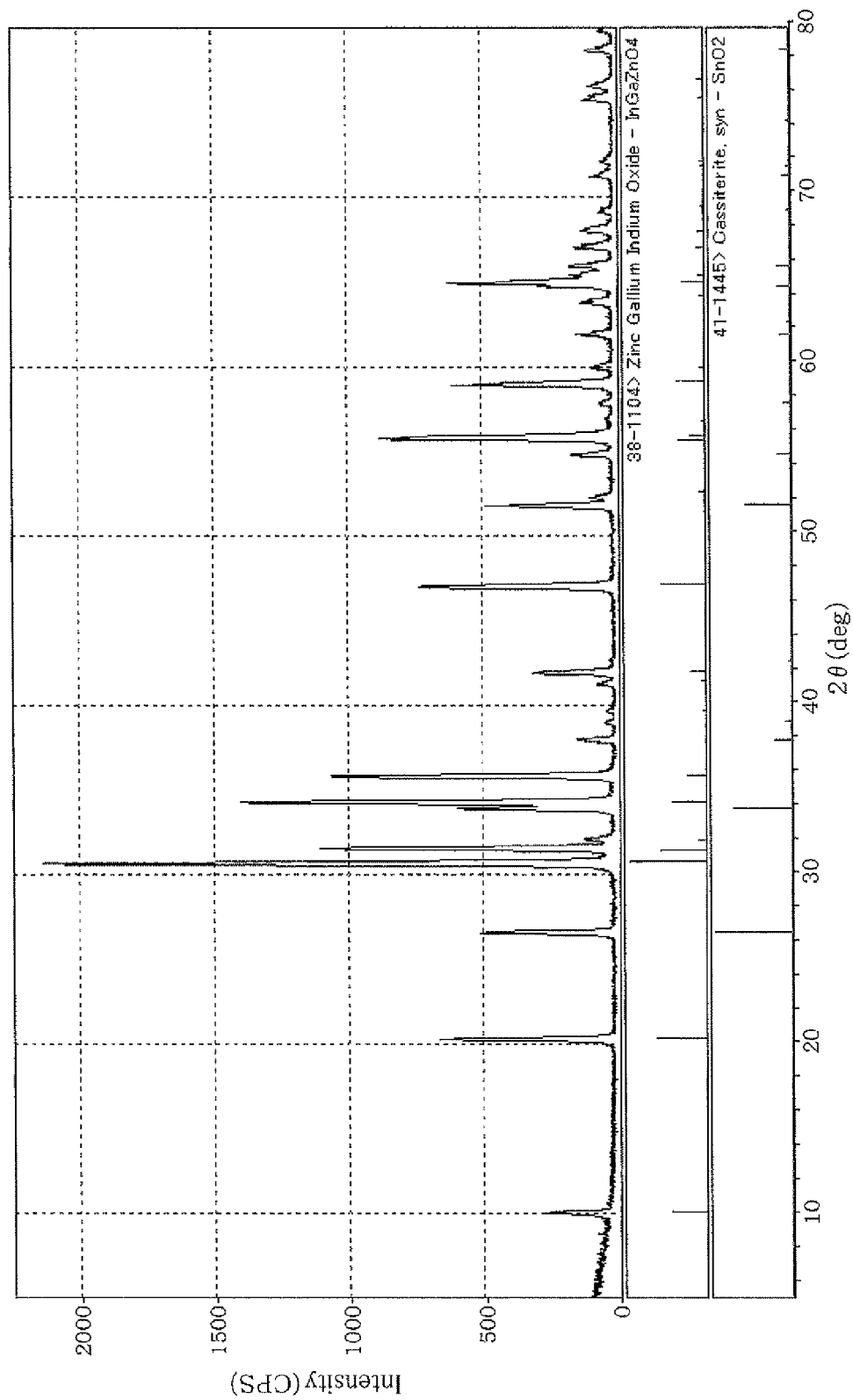
FIG. 9 is an X-ray diffraction chart of a sintered body produced in Comparative Example 2.
Figure 10:
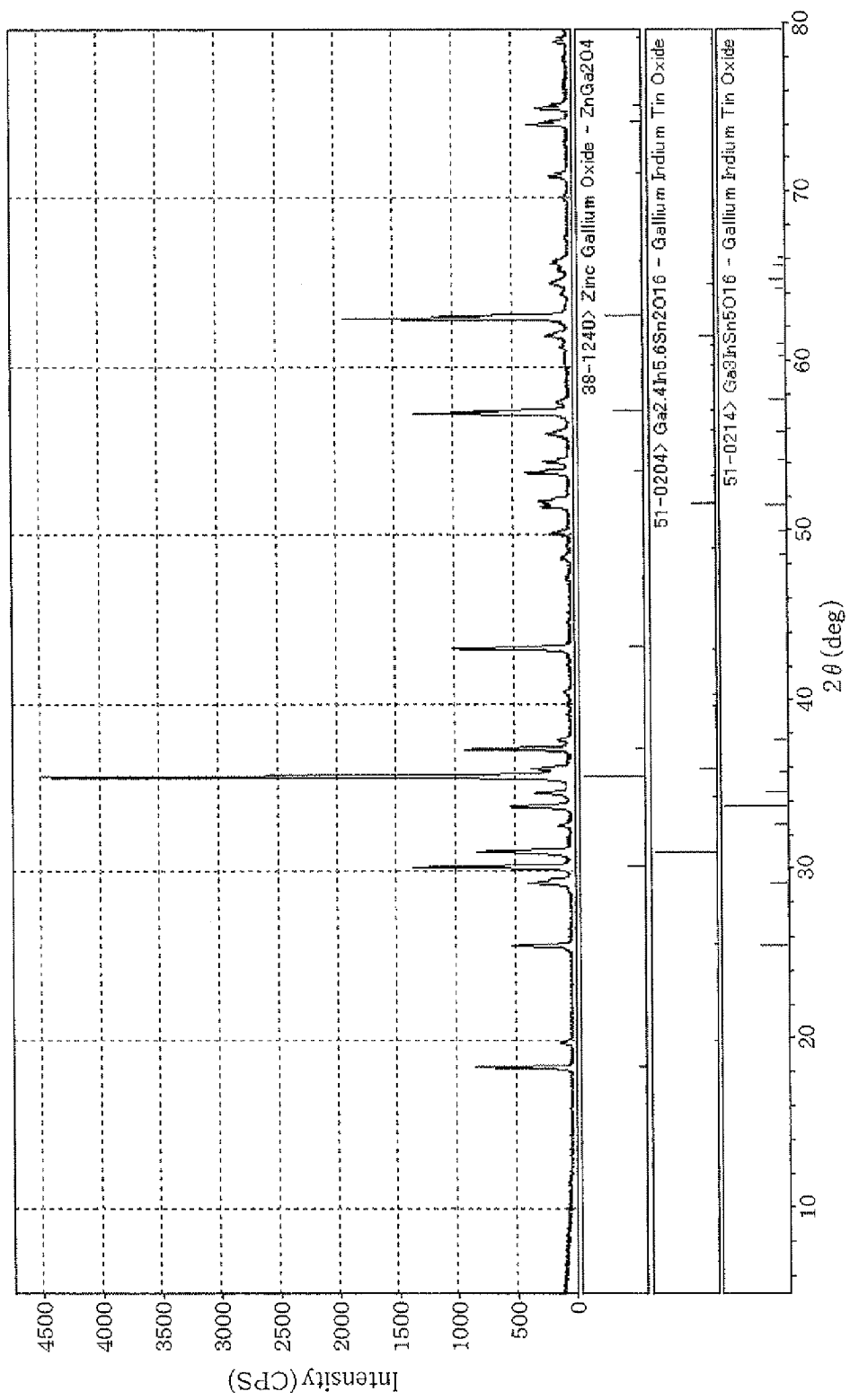
FIG. 10 is an X-ray diffraction chart of a sintered body produced in Comparative Example 3.
Figure 11:
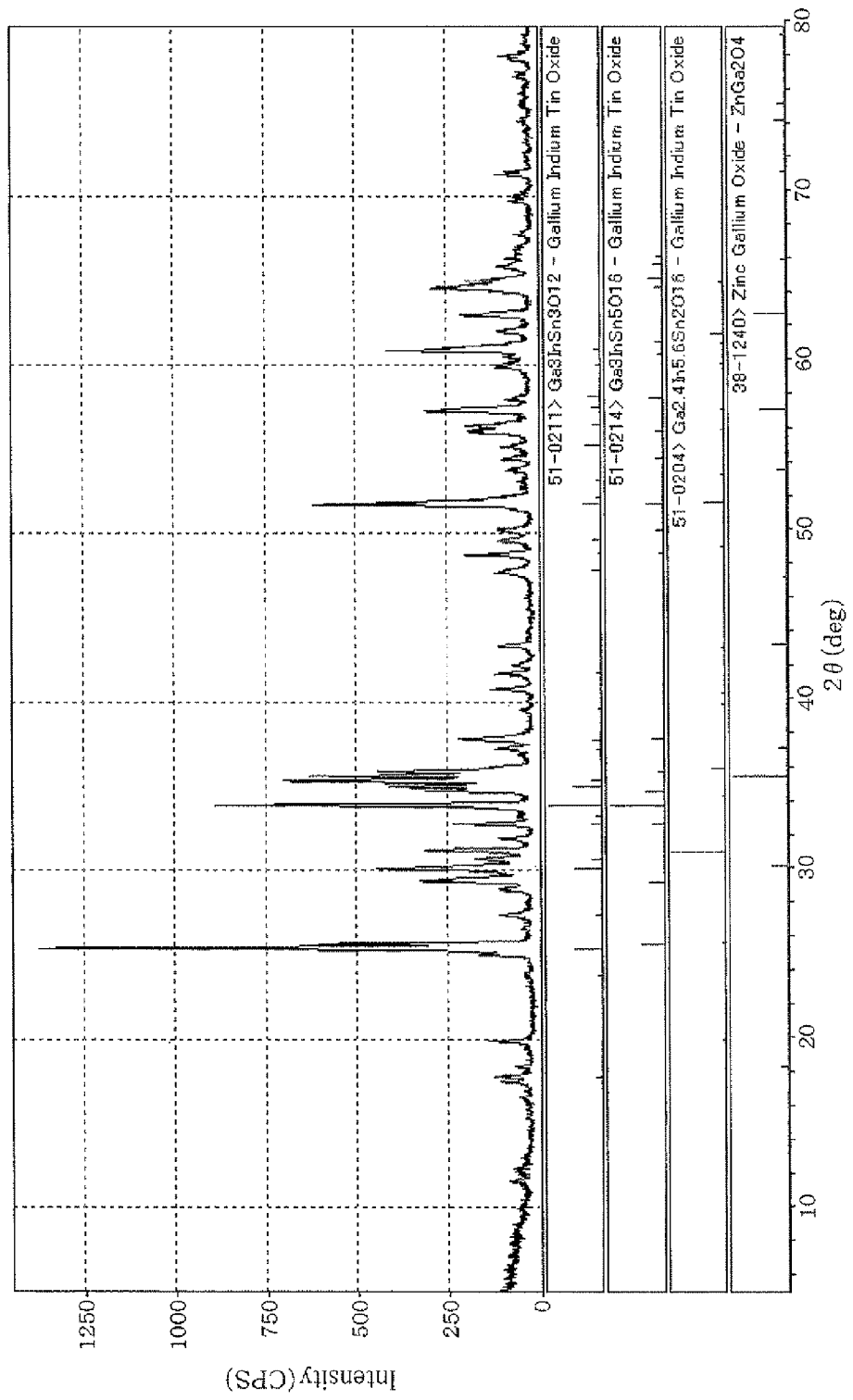
FIG. 11 is an X-ray diffraction chart of a sintered body produced in Comparative Example 4.

As a result, an oxide sintered body with a density of 5.97 $g/cm^3$ was obtained. It was confirmed that this sintered body contained $InGaZnO_4$. Although slight peaks derived from $ZnGa_2O_4$ were observed, almost no peak derived from a metal oxide other than $InZnGa_2O_4$ was observed (see FIG. 8). Therefore, it was confirmed that this sintered body contained as a main component $InGaZnO_4$.

The bulk resistance of this sintered body was 50 mΩcm.

The resulting sintered body was processed into a target in the same manner as in Example 1, and an oxide semiconductor film was formed by using an RF magnetron sputtering film forming apparatus. The film forming conditions were the same as those in Example 1, and an oxide semiconductor film with a thickness of about 100 nm was formed on a glass substrate. In this example, abnormal discharge occurred occasionally during film formation.

When a DC sputtering film forming apparatus was used, the target was broken during sputtering.

The resulting oxide semiconductor film was evaluated for PAN resistance in the same manner as in Example 1. As a result, the etching speed was found to be 100 nm/min, which showed that the oxide semiconductor film did not have resistance to PAN.

Examples 3 to 8 and Comparative Examples 2 to 4

An oxide semiconductor film was prepared in the same manner as in Example 1, except that the amount ratio of the raw material powder was changed to that shown in Table 1, and the oxide sintered body was evaluated for crystal structure, bulk resistance and performance during sputtering. The results are shown in Table 1. X-ray diffraction charts of Examples 3 to 7 and Comparative Examples 1 to 4 are shown in FIGS. 3 to 11.

INDUSTRIAL APPLICABILITY

The oxide sintered body of the invention can be used as a material for a target for physical film formation.

In addition, an oxide semiconductor film produced by using the target for physical film formation of the invention is suitable as a semiconductor layer which constitutes a switching element, a driving circuit element or the like of a liquid crystal display, a thin film electroluminescence display, an electrophoresis display, a moving particle display or the like. In particular, the oxide sintered body of the invention is preferable as an active layer of a TFT. In addition, it can be used in an RRAM (resistance random access memory).

The invention claimed is:

1. An oxide sintered body comprising an indium element (In), a gallium element (Ga), a zinc element (Zn) and a tin element (Sn), and comprising a compound shown by $Ga_2In_6Sn_2O_{16}$ or $(Ga,In)_2O_3$.

2. The oxide sintered body according to claim 1, wherein the atomic ratio of each element to the total (In+Ga+Zn+Sn) of the indium element (In), gallium element (Ga), zinc element (Sn) and tin element (Sn) satisfies the following relationships:

$$0.15<In/(In+Ga+Zn+Sn)<0.8$$

$$0.05<Ga/(In+Ga+Zn+Sn)<0.5$$

$$0.05<Zn/(In+Ga+Zn+Sn)<0.6$$

$$0.05<Sn/(In+Ga+Zn+Sn)<0.7.$$

3. A target for physical film formation which comprises the oxide sintered body according to claim 1.

4. The target for physical film formation according to claim 3, which is a sputtering target having a bulk resistance of less than 20 mΩcm.

5. An oxide semiconductor film formed by sputtering the target according to claim 3.

6. A thin film transistor which comprises as an active layer the oxide semiconductor film according to claim 5.

7. An oxide sintered body comprising an indium element (In), a gallium element (Ga), a zinc element (Zn) and a tin element (Sn), and comprising a compound shown by $Ga_2In_6Sn_2O_{16}$ and a compound shown by $In_2O_3$.

8. A target for physical film formation which comprises the oxide sintered body according to claim 7.

9. An oxide semiconductor film formed by sputtering the target according to claim 8.

10. A thin film transistor which comprises as an active layer the oxide semiconductor film according to claim 9.

11. An oxide sintered body comprising an indium element (In), a gallium element (Ga), a zinc element (Zn) and a tin element (Sn), and comprising a compound shown by $Ga_2In_6Sn_2O_{16}$ and a compound shown by $InGaZnO_4$.

12. A target for physical film formation which comprises the oxide sintered body according to claim 11.

13. An oxide semiconductor film formed by sputtering the target according to claim 12.

14. A thin film transistor which comprises as an active layer the oxide semiconductor film according to claim 13.

15. An oxide sintered body comprising an indium element (In), a gallium element (Ga), a zinc element (Zn) and a tin element (Sn), and comprising as a main component a compound shown by $Ga_{2.4}In_{5.6}Sn_2O_{16}$.

16. A target for physical film formation which comprises the oxide sintered body according to claim 15.

17. An oxide semiconductor film formed by sputtering the target according to claim 16.

18. A thin film transistor which comprises as an active layer the oxide semiconductor film according to claim 17.

* * * * *